United States Patent
Blazer

(10) Patent No.: US 10,374,601 B2
(45) Date of Patent: Aug. 6, 2019

(54) DISCRETE INPUT

(71) Applicant: Hamilton Sundstrand Corporation, Charlotte, NC (US)

(72) Inventor: Christopher Blazer, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 98 days.

(21) Appl. No.: 15/586,748

(22) Filed: May 4, 2017

(65) Prior Publication Data

US 2018/0323782 A1 Nov. 8, 2018

(51) Int. Cl.
- H03B 1/00 (2006.01)
- H03K 3/00 (2006.01)
- H03K 17/567 (2006.01)
- H03K 19/00 (2006.01)

(52) U.S. Cl.
CPC ........... H03K 17/567 (2013.01); H03K 19/00 (2013.01)

(58) Field of Classification Search
CPC .................................................. H03K 17/567
USPC ....................................................... 327/108
See application file for complete search history.

(56) References Cited

U.S. PATENT DOCUMENTS

| | | | |
|---|---|---|---|
| 7,061,734 B2 | 6/2006 | Zack et al. | |
| 7,233,165 B2 | 6/2007 | Jordy | |
| 7,692,474 B2 | 4/2010 | Stegmayr | |
| 9,570,927 B2 | 2/2017 | Kinzer et al. | |
| 2015/0334794 A1* | 11/2015 | Chou | H05B 41/2828 315/291 |

FOREIGN PATENT DOCUMENTS

| CN | 204013450 U | 12/2014 |
|---|---|---|
| DE | 19920465 C1 | 11/2000 |

OTHER PUBLICATIONS

Extended European Search Report dated Oct. 1, 2018, issued during the prosecution of corresponding European Patent Application No. EP 18170706.8 (11 pages).

* cited by examiner

*Primary Examiner* — Metasebia T Retebo
(74) *Attorney, Agent, or Firm* — Locke Lord LLP; Scott D. Wofsy; Joshua L. Jones

(57) ABSTRACT

An input device includes an input line connected to a voltage divider node for connecting a load to the voltage divider node. A first switching component connects to the voltage divider node. A first resistor connects to the voltage divider node for connecting a first voltage source to the input line. A second resistor connects between the input line and the voltage divider node for limiting current to the load, wherein the first voltage source is also connected to the first switching component. A second switching component is operatively connected to the first switching component, wherein the second switching component is configured to connect an second voltage source to a logic device for discrete input to the logic device that is decoupled from voltage supplied to the input line by the first voltage source for providing logic high and low input regardless of voltage supplied by the first voltage source.

13 Claims, 1 Drawing Sheet

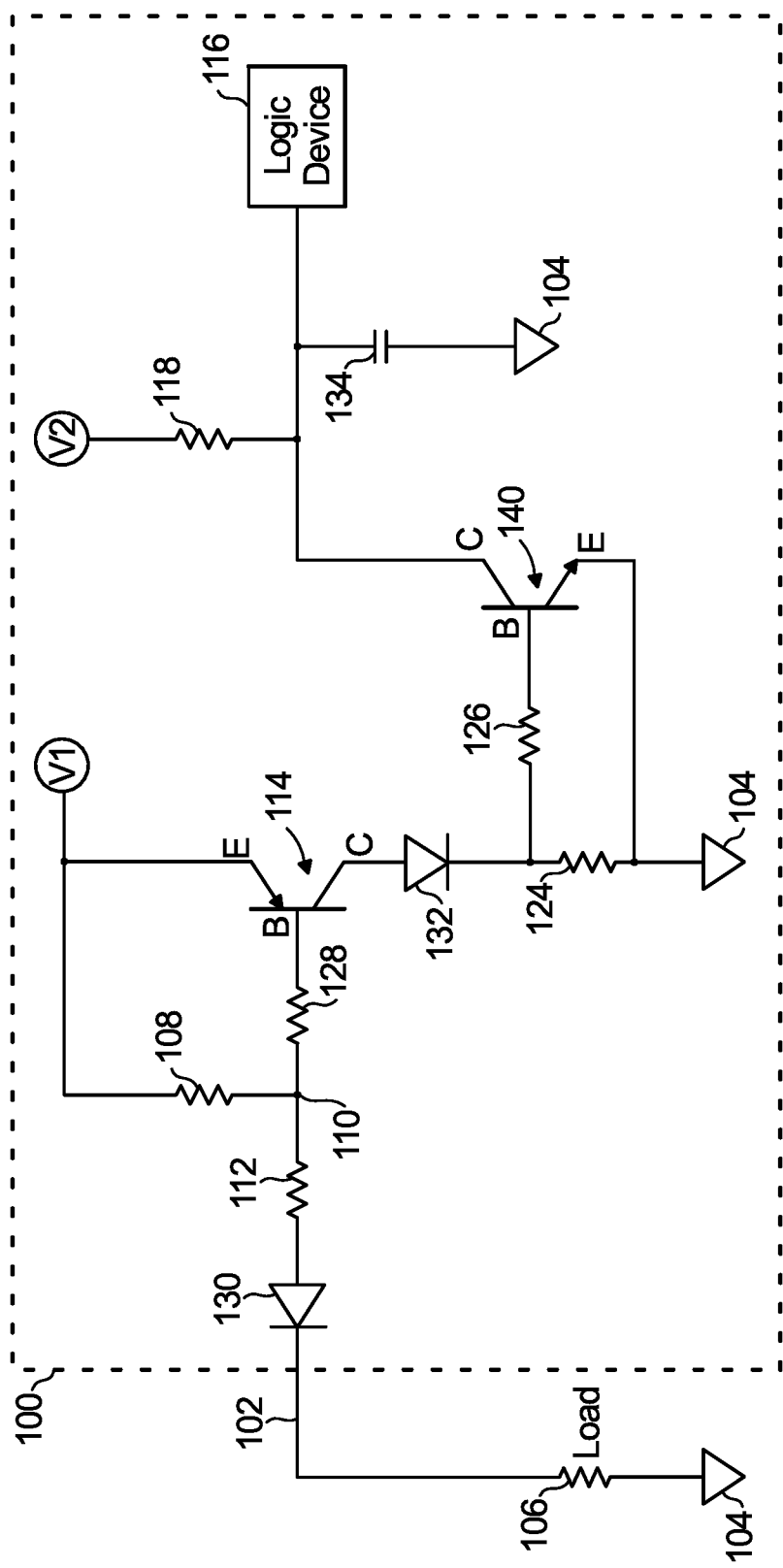

DISCRETE INPUT

BACKGROUND OF THE INVENTION

1. Field of the Invention

The present disclosure relates to inputs for logic components, and more particularly to ground open inputs and voltage open inputs.

2. Description of Related Art

Conventional topologies for ground open inputs provide a 'ground' indication to a logic component if a monitored load is connected (or provides a path to ground) and to provide an 'open' indication if the monitored load is not connected (or does not provide a path to ground). It is also a requirement to provide a specified current to the load. The conventional topologies are restricted in their operating range when the circuit has a power supply voltage that varies over a wide range. This problem is exacerbated by tolerance of the input voltage thresholds that are required by individual logic devices to register a logic high or logic low. Therefore, a conventional circuit must register a logic low when the voltage supply is at its maximum voltage while the logic input threshold is at its minimum voltage, as well as register a logic high when the voltage supply is at its minimum voltage while the logic input threshold is at its maximum voltage.

The conventional techniques have been considered satisfactory for their intended purpose. However, there is an ever present need for improved input devices. This disclosure provides a solution for this problem.

SUMMARY OF THE INVENTION

An input device includes an input line connected to a voltage divider node for connecting a load to the voltage divider node. A first switching component is connected to the voltage divider node. A first resistor is connected to the voltage divider node for connecting a first voltage source to the input line. A second resistor is connected between the input line and the voltage divider node for limiting current to the load, wherein the first voltage source is also connected to the first switching component. A second switching component is operatively connected to the first switching component, wherein the second switching component is configured to connect an second voltage source to a logic device for discrete input to the logic device that is decoupled from voltage supplied to the input line by the first voltage source for providing logic high and low input regardless of voltage supplied by the first voltage source.

The first switching component can include a first transistor having a base, collector, and emitter, wherein the base of the transistor is connected to the voltage divider node, wherein the collector is configured to be connected to ground, and wherein the emitter is configured to be connected to a first voltage source. The second switching component can include a second transistor having a base, collector, and emitter, wherein the base of the second transistor is connected to the collector of the first transistor, wherein the collector of the second transistor is configured to connect to the second voltage source, and wherein the emitter of the second transistor is configured to be connected to ground.

A logic device can be operatively connected to the collector of the second transistor. A third resistor can be connected to the collector of the second transistor for connecting the second voltage source to the second transistor. The first and third resistors can be configured to be connected to separate voltage sources from one another. The logic device can be connected to the collector of the second transistor to register a logic high when the second transistor is open and to register a logic low when the second transistor is closed.

A fourth resistor can be connected to the collector of the first transistor for limiting the current through the first transistor. A fourth resistor can be connected to the base of the first transistor to limit the base current for the first transistor. A fifth resistor can be connected to the base of the second transistor to limit base current for the second transistor. A sixth resistor can be connected to the collector of the second transistor for limiting the current through the second transistor. A first diode can be connected to the input line to block unwanted voltage inputs and/or lightning transients. A second diode can be connected to the collector of the first transistor to block negative lightning events. A capacitor can be connected to the collector of the second transistor to ground to add a switching delay to the logic device.

A first voltage source can be operatively connected to the first resistor and a second voltage source separate from the first voltage source operatively connected to the second switching component. A load can be operatively connected to the input line.

A method of providing discrete input to a logic device regarding state of a load includes powering an input line connected to a load and to a switching component to allow current through the switching component. The method also includes switching the switching component based on voltage on the input line to provide discrete input to a logic device regarding the state of the load independent of voltage supplied to the input line. The switching component can include a transistor, wherein the base of the transistor is connected to the input line for switching current through a resistor, wherein providing discrete input to a logic device includes determining whether or not a voltage is applied across the resistor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 1 is a schematic view of an exemplary embodiment of an input device constructed in accordance with the present disclosure, showing two options for operatively connecting a logic device to receive a discrete input independent of the voltage supplied to the input line.

DETAILED DESCRIPTION OF THE PREFERRED EMBODIMENTS

Reference will now be made to the drawings wherein like reference numerals identify similar structural features or aspects of the subject disclosure. For purposes of explanation and illustration, and not limitation, a partial view of an exemplary embodiment of an input device in accordance with the disclosure is shown in FIG. 1 and is designated generally by reference character 100. The systems and methods described herein can be used to provide discrete input to a logic device indicative of the state of a load independent of the voltage supplied to the load.

The input device 100 includes an input line 102 with a voltage divider node 110 for connecting a load 106 to the input line 102 for providing input regarding state of the load 106. The cathode C of a first diode 130 is connected to the input line 102 to protect the input device 100 from lightning and other transients. A first resistor 108 is connected between the voltage divider node 110 and the voltage source V1, e.g., a voltage source for the load 106, or first voltage source, and is used for creating a voltage drop across the emitter E and base B of a PNP style transistor 114, i.e., the first transistor 114, when a load 106 is connected to the input device 100. The voltage drop across the base B and emitter E of the PNP style transistor 114 causes the PNP style transistor 114 to close. When this first transistor 114 closes, voltage source V1 provides current to a third resistor 124. A second resistor 112 is connected between the voltage divider node 110 and the anode A of the first diode 130 and is used for limiting the current provided to the load 106 from voltage source V1. The base B of the first transistor 114 is connected to a fourth resistor 128 that limits the current into the base B of the first transistor 114. The emitter E of first transistor 114 is connected to the voltage source V1. The collector C of first transistor 114 is connected to the anode A of a second diode 132. The second diode 132 is used to protect the input device 100 from negative lightning transients or the like. When the first transistor 114 closes and allows voltage source V1 to provide current to the third resistor 124, a voltage is developed across base B and emitter E of a NPN style transistor 140, i.e., the second transistor 140. The voltage across the base B and emitter E of second transistor 140 causes the second transistor 140 to close. A fifth resistor 126 is connected between the base B of second transistor 140 and the cathode C of the second diode 132 and is used to limit the current into the base of second transistor 140. The emitter E of the second transistor 140 is connected to ground 104. The collector C of the second transistor 140 is connected to the input of the logic device 116. A sixth resistor 118 is connected between the second voltage source V2, a voltage source for the input, and the collector C of second transistor 140 and is used to limit the current through second transistor 140. A capacitor 134 is connected between the input to the logic device 116 and ground 104 and is used to provide a time delay to the logic device 116 to prevent the logic device 116 from responding to noise or other short duration voltage spikes at the input line 102. The voltage source V2 provides the input voltage to the logic device 116 depending on the state of the second transistor 140. The load 106, the third resistor 124, the capacitor 134, and the emitter E of second transistor 140 are all connected to a single, common ground 104.

When a low impedance load 106 is connected to the input line 102 of the input device 100, a voltage is developed across resistor 108 which causes the first transistor 114 to close. When first transistor 114 closes, current flows through resistor 124 and causes the second transistor 140 to close. When second transistor 140 closes, the input voltage of the logic device 116, supplied by voltage source V2, is pulled to ground 104, providing a logic low as input to input device 116.

When a high impedance load 106 is connected to the input line 102 of the input device 100, there is no voltage drop across the resistor 108. This causes first transistor 114 to be in the open state. When first transistor 114 is in the open state, no current flows through the third resistor 124 and therefore, there is no voltage drop across the third resistor 124. With no voltage drop across resistor 124, the second transistor 140 is in open state. When the second transistor 140 is in the open state, there is no current draw through the sixth resistor 118 and the input voltage to the logic device is at the same level as the voltage source V2, providing a logic high as input to input device 116.

A method of providing a discrete input to a logic device, e.g., logic device 116, regarding state of a load, e.g. whether load 106 is high impedance or low impedance, includes powering an input line connected to a load, e.g., input line 102, and to a first switching component 114 to allow current through the first switching component 114, e.g. first transistor 114, which will then control a second switching component 140, e.g. second transistor 140, which controls the input to the logic device provided by a second voltage source. The method includes switching the switching component based on voltage on the input line to provide discrete input to the logic device regarding state of the load independent of voltage supplied to the input line. Providing discrete input to a logic device can include determining whether or not a voltage is applied across a resistor, e.g. across resistor 124.

Ground/open discrete input as disclosed herein uses two transistors to decouple the logic device that drives the status signal for the discrete input. This provides a tunable ground/open discrete input that meets ground/open indications requirement over the entire range of supply voltages. The status signal is supplied by a separate source, e.g. voltage source V2, than the wetting current source for the load, e.g., voltage source V1. This allows requirements for logic high and logic low to be met for the logic device over the whole range of supply voltages from voltage source V1. Conventional techniques rely on the wetting current source to be divided down to meet the threshold requirements of the logic device that drives that status signal.

The methods and systems of the present disclosure, as described above and shown in the drawings, provide for discrete input with superior properties including decoupling the voltage supplied to the load and input line from the voltage source for the input to the logic device. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An input device comprising:
an input line connected to a voltage divider node for connecting a load to the voltage divider node;
a first switching component connected to the voltage divider node;
a first resistor connected to the voltage divider node for connecting a first voltage source to the input line;
a second resistor connected between the input line and the voltage divider node for limiting current to the load, wherein the first voltage source is also connected to the first switching component; and
a second switching component operatively connected to the first switching component, wherein the second switching component is configured to connect a second voltage source to a logic device for discrete input to the logic device that is decoupled from voltage supplied to the input line by the first voltage source for providing logic high and low input regardless of voltage supplied by the first voltage source, wherein the first switching component includes a first transistor having a base, collector, and emitter, wherein the base of the first transistor is connected to the voltage divider node, wherein the collector is configured to be connected to ground, and wherein the emitter is configured to be connected to the first voltage source, and wherein the second switching component includes a second transistor having a base, collector, and emitter, wherein the base of the second transistor is connected to the collector of the first transistor, wherein the collector of the second transistor is configured to connect to the second voltage source, and wherein the emitter of the second transistor is configured to be connected to ground, wherein the logic device is operatively connected to the collector of the second transistor.

2. The input device as recited in claim 1, further comprising: a sixth resistor connected to the collector of the second transistor for connecting the second voltage source to the second transistor.

3. The input device as recited in claim 2, wherein the first and sixth resistors are configured to be connected to separate voltage sources from one another.

4. The input device as recited in claim 2, wherein the logic device is connected to the collector of the second transistor to register a logic high when the second transistor is open and to register a logic low when the second transistor is closed.

5. The input device as recited in claim 1, further comprising:
a third resistor connected to the collector of the first transistor for limiting the current through the first transistor.

6. The input device as recited in claim 5, further comprising:
a fourth resistor connected to the base of the first transistor to limit the base current for the first transistor.

7. The input device as recited in claim 6, further comprising:
a fifth resistor connected to the base of the second transistor to limit base current for the second transistor.

8. The input device as recited in claim 7, further comprising:
a sixth resistor connected to the collector of the second transistor for limiting the current through the second transistor.

9. The input device as recited in claim 1, further comprising:
a first diode connected to the input line to block unwanted voltage inputs and/or lightning transients.

10. The input device as recited in claim 9, further comprising:
a second diode connected to the collector of the first transistor to block negative lightning events.

11. The input device as recited in claim 1, further comprising:
a capacitor connecting the collector of the second transistor to ground to add a switching delay to the logic device.

12. An input device comprising: an input line connected to a voltage divider node for connecting a load to the voltage divider node; a first switching component connected to the voltage divider node; a first resistor connected to the voltage divider node for connecting a first voltage source to the input line; a second resistor connected between the input line and the voltage divider node for limiting current to the load, wherein the first voltage source is also connected to the first switching component; and a second switching component operatively connected to the first switching component, wherein the second switching component is configured to connect a second voltage source to a logic device for discrete input to the logic device that is decoupled from voltage supplied to the input line by the first voltage source for providing logic high and low input regardless of voltage supplied by the first voltage source, wherein the first voltage source is operatively connected to the first resistor and the second voltage source separate from the first voltage source operatively connected to the second switching component.

13. An input device comprising:
an input line connected to a voltage divider node for connecting a load to the voltage divider node;
a first switching component connected to the voltage divider node;
a first resistor connected to the voltage divider node for connecting a first voltage source to the input line;
a second resistor connected between the input line and the voltage divider node for limiting current to the load, wherein the first voltage source is also connected to the first switching component; and
a second switching component operatively connected to the first switching component, wherein the second switching component is configured to connect a second voltage source to a logic device for discrete input to the logic device that is decoupled from voltage supplied to the input line by the first voltage source for providing logic high and low input regardless of voltage supplied by the first voltage source, wherein the load is operatively connected to the input line of the input device.

* * * * *